US011373891B2

(12) United States Patent
Reuter et al.

(10) Patent No.: US 11,373,891 B2
(45) Date of Patent: Jun. 28, 2022

(54) FRONT-DUCTED EQUIPMENT FRONT END MODULES, SIDE STORAGE PODS, AND METHODS OF OPERATING THE SAME

(71) Applicant: Applied Materials, Inc., Santa Clara, CA (US)

(72) Inventors: Paul B. Reuter, Austin, TX (US); Robin C. Armstrong, Mountain View, CA (US); John C. Menk, Round Rock, TX (US); Nir Merry, Mountain View, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 206 days.

(21) Appl. No.: 16/660,057

(22) Filed: Oct. 22, 2019

(65) Prior Publication Data

US 2020/0135523 A1  Apr. 30, 2020

Related U.S. Application Data

(60) Provisional application No. 62/751,514, filed on Oct. 26, 2018.

(51) Int. Cl.
*H01L 21/673* (2006.01)

(52) U.S. Cl.
CPC ............... *H01L 21/67389* (2013.01)

(58) Field of Classification Search
CPC .................................................. H01L 21/67389
See application file for complete search history.

(56) References Cited

U.S. PATENT DOCUMENTS 9,105,673 B2  8/2015 Babbs et al.
9,524,892 B2  12/2016 Rebstock
(Continued)

FOREIGN PATENT DOCUMENTS

JP  2015-146349 A  8/2015
JP  2017-011150 A  1/2017
(Continued)

OTHER PUBLICATIONS

International Search Report and Written Opinion for International Application No. PCT/US2019/057646, 12 pages, dated Feb. 17, 2020.
(Continued)

*Primary Examiner* — Saul Rodriguez
*Assistant Examiner* — Ashley K Romano
(74) *Attorney, Agent, or Firm* — Lowenstein Sandler LLP

(57) ABSTRACT

Equipment front end module (EFEM) includes front located return ducts. The EFEM may include a front wall, a rear wall, and two side walls, the front wall including a plurality of load ports, and the rear wall configured to couple to a load lock apparatus. An EFEM chamber is formed between the front wall, the rear wall, and the two side walls. An upper plenum is positioned at a top of the EFEM and includes an opening into the EFEM chamber. Return ducts provide a return gas flow path enabling recirculation of gas from the EFEM chamber to the upper plenum. At least some of the plurality of return ducts are located between the load ports. Electronic device manufacturing assemblies and methods of operating equipment front end modules are also disclosed.

23 Claims, 10 Drawing Sheets

(56) References Cited

U.S. PATENT DOCUMENTS

| | | |
|---|---|---|
| 10,192,765 B2 | 1/2019 | Koshti et al. |
| 10,359,743 B2 | 7/2019 | Rice et al. |
| 10,522,379 B2 | 12/2019 | Kong et al. |
| 10,566,216 B2 | 2/2020 | Senn et al. |
| 10,763,134 B2 | 9/2020 | Rice |
| 10,777,437 B2 | 9/2020 | Fukasawa |
| 2011/0114129 A1 | 5/2011 | Kishkovich |
| 2015/0101482 A1 | 4/2015 | Chou et al. |
| 2015/0170945 A1 | 6/2015 | Segawa et al. |
| 2015/0228515 A1 | 8/2015 | Hyon |
| 2015/0228518 A1 | 8/2015 | Hyon |
| 2016/0118279 A1* | 4/2016 | Iyer .................. H01L 21/67772 427/8 |
| 2016/0118282 A1 | 4/2016 | Maraschin et al. |
| 2016/0284580 A1 | 9/2016 | Woo et al. |
| 2017/0011942 A1 | 1/2017 | Woo et al. |
| 2017/0125272 A1* | 5/2017 | van Gogh ........... H01L 21/6719 |
| 2017/0170042 A1 | 6/2017 | Okabe et al. |
| 2018/0114710 A1 | 4/2018 | Jeong et al. |
| 2018/0124960 A1 | 5/2018 | Vincent et al. |
| 2018/0286726 A1 | 10/2018 | Rebstock |
| 2018/0374725 A1 | 12/2018 | Holeyannavar et al. |
| 2018/0374733 A1 | 12/2018 | Pannese |
| 2019/0287822 A1* | 9/2019 | Woo .................. H01L 21/67766 |
| 2019/0326134 A1* | 10/2019 | Suzuki ............. H01L 21/67766 |
| 2020/0135499 A1 | 4/2020 | Pannese et al. |
| 2020/0135520 A1 | 4/2020 | Reuter et al. |
| 2020/0135521 A1 | 4/2020 | Reuter et al. |
| 2020/0135522 A1* | 4/2020 | Reuter ............. H01L 21/67383 |
| 2020/0135523 A1 | 4/2020 | Reuter et al. |
| 2020/0135525 A1 | 4/2020 | Reuter et al. |
| 2020/0350193 A1 | 11/2020 | Garssen |

FOREIGN PATENT DOCUMENTS

| | | |
|---|---|---|
| KR | 10-1215962 B1 | 12/2012 |
| KR | 10-1637498 B1 | 7/2016 |
| KR | 10-1682473 B1 | 12/2016 |
| KR | 10-2018-0074276 A | 7/2018 |

OTHER PUBLICATIONS

International Search Report and Written Opinion for International Application No. PCT/US2019/057650, 12 pages, dated Feb. 12, 2020.

* cited by examiner

FRONT-DUCTED EQUIPMENT FRONT END MODULES, SIDE STORAGE PODS, AND METHODS OF OPERATING THE SAME

REFERENCE TO EARLIER FILED APPLICATION

This application claims the benefit under 35 U.S.C. § 119(e) of U.S. Provisional Patent Application No. 62/751,514, filed Oct. 26, 2018, which is incorporated herein, in its entirety, by this reference.

TECHNICAL FIELD

This disclosure relates to electronic device manufacturing, and more particularly to equipment front end modules (EFEMs), side storage pods, and methods of operating the same.

BACKGROUND

Processing of substrates in semiconductor electronic device manufacturing is generally carried out in multiple process tools, where substrates travel between process tools in substrate carriers, such as, e.g., front opening unified pods (FOUPs). A FOUP may be docked at a load port of an equipment front end module (EFEM), where one or more substrates may be transferred to load lock apparatus, and from there, to a transfer chamber of a mainframe housing having multiple process chambers arranged there around. An environmentally-controlled atmosphere may be provided within and between the FOUP and each of the process chambers, and particularly within the EFEM. Exposure of the substrates to certain environmental conditions and gases during processing may, in some instances, degrade the substrates.

SUMMARY

According to a first embodiment, an equipment front end module (EFEM) is provided. The EFEM includes a front wall, a rear wall, and two side walls, the front wall may include a plurality of load ports, and the rear wall be configured to couple to a load lock apparatus. An equipment front end module chamber may be formed between the front wall, the rear wall, and the two side walls. An upper plenum may be positioned at a top of the equipment front end module and include an opening into the equipment front end module chamber. A plurality of return ducts may provide a return gas flow path enabling recirculation of gas from the equipment front end module chamber to the upper plenum, wherein at least some of the plurality of return ducts are located between the load ports.

According to a second embodiment, an electronic device manufacturing assembly is provided. The electronic device manufacturing assembly may include an equipment front end module including a front wall, a rear wall, and two side walls, where the front wall may include a plurality of load ports and the rear wall configured to couple to a load lock apparatus. An equipment front end module chamber may be formed between the front wall, the rear wall, and the two side walls. An upper plenum may be positioned at a top of the equipment front end module and include an opening into the equipment front end module chamber. A plurality of return ducts may provide a return gas flow path enabling recirculation of gas from the equipment front end module chamber to the upper plenum, where at least some of the plurality of return ducts are located between some of the plurality of load ports. A first side storage pod may be coupled to a first side wall of the two side walls of the equipment front end module via an interface opening in the first side wall, the side storage pod configured to receive one or more substrates from the equipment front end module chamber. The side storage pod may include an exhaust channel. The electronic device may further include a first side return duct coupled between the exhaust channel and the upper plenum.

According to yet another embodiment of the disclosure, a method of operating an equipment front end module (EFEM) is provided. The method may include providing the equipment front end module with an upper plenum connected to an equipment front end module chamber, the equipment front end module chamber interfacing with a plurality of load ports. The method may further include flowing gas from the upper plenum to the equipment front end module chamber. The method may further include recirculating at least some of the gas from the equipment front end module chamber to the upper plenum through one or more return ducts positioned between the load ports.

Still other aspects, features, and advantages in accordance with these and other embodiments of the disclosure may be readily apparent from the following detailed description, the appended claims, and the accompanying drawings. Accordingly, the drawings and descriptions herein are to be regarded as illustrative in nature, and not as restrictive.

BRIEF DESCRIPTION OF THE DRAWINGS

The drawings, described below, are for illustrative purposes and are not necessarily drawn to scale. The drawings are not intended to limit the scope of the disclosure in any way.

DETAILED DESCRIPTION

Figure 1:
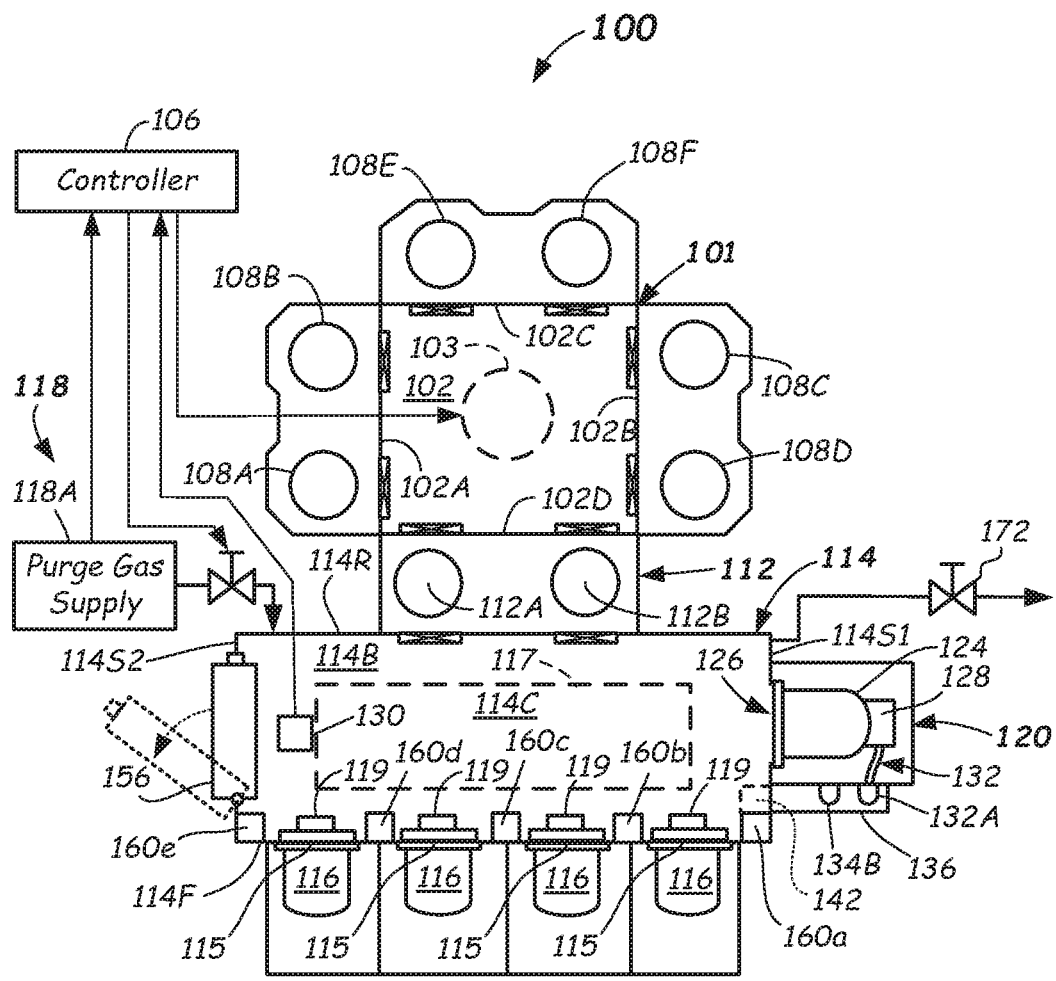
FIG. 1 illustrates a schematic top view of an electronic device manufacturing assembly according to one or more embodiments of the disclosure.

Reference will now be made in detail to the example embodiments of this disclosure, which are illustrated in the accompanying drawings. Wherever possible, the same reference numbers will be used throughout the drawings to refer to the same or like parts throughout the several views. Features of the various embodiments described herein may be combined with each other, unless specifically noted otherwise.

Electronic device manufacturing may involve exposing substrates to different chemicals during a plurality of processes. Between the application of different processes to the substrates, the substrates may undergo outgassing. Some processes applied to the substrate may cause the substrate to outgas corrosive chemicals, such as fluorine, bromine, and chlorine. If these chemicals and byproducts thereof are not properly removed from the substrates, it may cause certain defects in the substrates.

According to one or more embodiments of the disclosure, electronic device manufacturing assemblies and methods of operating EFEMs are provided to improved substrate processing. The assemblies and methods described herein may provide efficiency and/or processing improvements in the processing of substrates by controlling environmental exposure of the substrates and, in particular, by controlling conditions within one or more side storage pods coupled to an equipment front end module (EFEM). One or more side storage containers may be configured to be received within a side storage pod and may include substrate holders (e.g., shelves) configured to receive and support substrates thereon, such as during idle periods before and/or after application of processes to the substrates.

Purge gas may flow from the EFEM chamber into a side storage container to the side storage pod (SSP), where the purge gas flows past substrates located therein. The purge gas may be exhausted from the rear of the side storage container and returned to an upper plenum of the EFEM via a side return duct. Optionally, the purge gas may be passed through a chemical filter of the SSP to output filtered gas therefrom. In some embodiments, the recirculation path of the purge gas may pass through a plurality of return ducts. Each of the return ducts may extend upward from the EFEM chamber and alongside a front wall of the EFEM and then back into the upper plenum. At least some of the return ducts are positioned at a location between the load ports where FOUPs are docked. The return ducts may extend upward from the EFEM chamber on an inside of the front wall, outside of the front wall or both. This may minimize the space occupied by the recirculation path. Moreover, it may enable the addition of a second SSP on another side wall of the EFEM. The gas recirculated into the EFEM from the side storage container may, when a filter is optionally used, be substantially free of certain gases that have been filtered or substantially reduced by the chemical filter. In some embodiments, the SSP may include heating therein. In addition, the gas, to which the substrates are exposed within the EFEM, may have certain desired environmental conditions, such as being relatively dry, being heated, and/or having relatively low oxygen levels.

Further details of example embodiments of EFEMs, side storage pods, electronic device manufacturing assemblies including EFEMs and a side storage pod, and methods of operating EFEMs are described herein with reference to FIGS. 1-8 herein.

FIG. 1 illustrates a schematic diagram of an example embodiment of an electronic device manufacturing assembly 100 according to one or more embodiments of the present disclosure. The electronic device manufacturing assembly 100 may include a mainframe housing 101 having housing walls defining a transfer chamber 102. A transfer robot 103 (shown as a dotted circle) may be at least partially housed within the transfer chamber 102. The transfer robot 103 may be configured to place and remove substrates to and from various destinations via operation of arms (not shown) of the transfer robot 103. Substrates as used herein may mean articles used to make electronic devices or circuit components, such as semiconductor wafers, silicon-containing wafers, patterned wafers, glass plates, and the like.

The motion of the various arm components of the transfer robot 103 may be controlled by suitable commands to a drive assembly (not shown) containing a plurality of drive motors of the transfer robot 103 as commanded from a controller 106. Signals from the controller 106 may cause motion of the various components of the transfer robot 103. Suitable feedback mechanisms may be provided for one or more of the components by various sensors, such as position encoders, and the like.

The transfer chamber 102 shown may be square but could be slightly rectangular, hexagonal, octagonal, or another polygonal shape and may include a first facet 102A, second facet 102B, a third facet 102C, and a fourth facet 102D. In the embodiment shown, the transfer robot 103 may be adept at transferring and/or retracting dual substrates at a same time into the chamber sets. The first facet 102A, second facet 102B, third facet 102C, and fourth facet 102D may be planar and entryways into the sets of process chambers may lie along the respective facets. However, other suitable shapes of the mainframe housing 101, numbers of facets and process chambers, and types of robots are possible.

The destinations for the transfer robot 103 may be any one or more of the process chambers 108A-108F, which may be configured and operable to carry out a process on the substrates delivered thereto. The process may be any suitable process such as plasma vapor deposition (PVD) or chemical vapor deposition (CVD), etch, annealing, pre-clean, metal or metal oxide removal, and the like. Other processes may be carried out on substrates therein.

Substrates may be received into the transfer chamber 102 from an EFEM 114, and may exit the transfer chamber 102 to the EFEM 114, through a load lock apparatus 112, which is coupled to a rear wall 114R of the EFEM 114. The load lock apparatus 112 may include one or more load lock chambers (e.g., load lock chambers 112A and 112B) therein. Load lock chambers 112A and 112B may be single wafer load lock (SWLL) chambers, multi-wafer chambers, or combinations thereof. Other numbers of load locks may be included.

The EFEM 114 may be an enclosure having various enclosure walls, such as, e.g., front wall 114F, rear wall 114R, two side walls 114S1, 114S2, a top 114T (FIG. 2A), and a bottom 114B, forming an EFEM chamber 114C. Each of the front 114F, rear 114R, and two side walls 114S1, 114S2 may have one or more interface openings to facilitate substrate exchange and/or coupling to other components. One or more load ports 115 may be provided on the front wall 114F of the EFEM 114 as shown in FIG. 1. The one or more load ports 115 may each be configured to receive and dock a respective substrate carrier 116 (e.g., FOUP) thereat.

Although four load ports 115 and four substrate carriers 116 are shown, other embodiments may have more or less numbers of load ports 115 and substrate carriers 116 docked at the EFEM 114.

EFEM 114 may include a suitable load/unload robot 117 (shown dotted) of conventional construction within the EFEM chamber 114C thereof. The load/unload robot 117 may be configured and operational, once a carrier door of a substrate carrier 116 is opened via a carrier door opener 119 for each of the load ports 115, to extract substrates from the substrate carrier 116 and to feed the substrates through the EFEM chamber 114C and into the one or more load lock chambers 112A and 112B of the load lock apparatus 112.

The side storage pod 120 may be coupled to a side wall 114S1 of the EFEM 114. In particular, the load/unload robot 117 may further be configured to extract substrates from and load substrates into the side storage pod 120 prior to and/or after processing in one or more of the process chambers 108A-108F. In some embodiments, the load/unload robot 117 is a high-Z robot configured to access substrates stacked 26 high, or even 52 high or higher, in the side storage pod 120.

In the embodiment shown, the EFEM chamber 114C may be provided with environmental controls providing an environmentally-controlled atmosphere therein. In particular, an environmental control system 118 may be coupled to the EFEM 114 and may be operational to monitor and/or control environmental conditions within the EFEM chamber 114C. In some embodiments, and at certain times, the EFEM chamber 114C may receive a purge gas (e.g., an inert and/or non-reactive gas) therein, such as, e.g., argon (Ar), nitrogen ($N_2$), helium (He), or clean dry air from purge gas supply 118A. The purge gas supply 118A may be coupled by suitable conduits and one or more valves to the EFEM chamber 114C. The environmental conditions within the EFEM chamber 114C may be present in the interiors of side storage containers 124 and 224 (FIG. 2) located within and as part of the side storage pod 120. The side storage containers 124 and 224 receive substrates 435 (FIG. 4) vertically stacked therein. In some embodiments, the side storage pod 120 may have substrate holders located therein to receive and support substrates.

In more detail, the environmental control system 118 may control at least one of: 1) relative humidity (RH), 2) temperature (T), 3) an amount of oxygen ($O_2$), and/or 4) an amount of purge gas, within the EFEM chamber 114C. Other environmental conditions of the EFEM 114 may be monitored and/or controlled, such as gas flow rate into the EFEM chamber 114C, or pressure within the EFEM chamber 114C, or both.

In some embodiments, environmental control system 118 includes the controller 106. Controller 106 may include suitable processor, memory, and electronic components for receiving inputs from various sensors and for controlling one or more valves to control the environmental conditions within the EFEM chamber 114C. Environmental control system 118 may, in one or more embodiments, monitor relative humidity (RH) by sensing RH in the EFEM 114 with a sensor 130. Any suitable type of sensor that measures relative humidity may be used, such as a capacitive-type sensor. The RH may be lowered by flowing a suitable amount of purge gas from the purge gas supply 118A of the environmental control system 118 into the EFEM chamber 114C. In some embodiments, compressed bulk inert gases having low $H_2O$ levels (e.g., purity≥99.9995%, $H_2O$≤5 ppm) may be used as the purge gas supply 118A in the environmental control system 118, for example. Other suitably low $H_2O$ levels may be used.

In another aspect, the sensor 130 may measure a plurality of environmental conditions. For example, in some embodiments, the sensor 130 may measure the relative humidity value as discussed above. In one or more embodiments, the pre-defined reference relative humidity value may be less than 1000 ppm moisture, less than 500 ppm moisture, or even less than 100 ppm moisture, depending upon the level of moisture that is tolerable for the particular process being carried out in the electronic device manufacturing assembly 100 or particular substrates exposed to the environment of the EFEM 114.

The sensor 130 may also measure a level of oxygen ($O_2$) within the EFEM 114. In some embodiments, a control signal from the controller 106 to the environmental control apparatus 118 initiating a flow of a suitable amount of purge gas from the purge gas supply 118A into the EFEM chamber 114C may take place to control the level of oxygen ($O_2$) to below a threshold $O_2$ value. In one or more embodiments, the threshold $O_2$ value may be less than 50 ppm, less than 10 ppm, or even less than 5 ppm, depending upon the level of $O_2$ that is tolerable (not affecting quality) for the particular process being carried out in the electronic device manufacturing assembly 100 or particular substrates 435 exposed to the environment of the EFEM 114. In some embodiments, the sensor 130 may sense the level of oxygen in the EFEM chamber 114C to ensure it is above a safe threshold level to allow entry into the EFEM chamber 114C.

The sensor 130 may further measure the absolute or relative pressure within the EFEM 114. In some embodiments, the controller 106 may control the amount of flow of purge gas from the purge gas supply 118A into the EFEM chamber 114C to control the pressure in the EFEM chamber 114C.

In the embodiments shown herein, the controller 106 may include a processor, memory, and peripheral components configured to receive control inputs (e.g., relative humidity and/or oxygen) from the sensor 130 and to execute a closed loop or other suitable control scheme. In one embodiment, the control scheme may change a flow rate of the purge gas being introduced into the EFEM 114 to achieve a predetermined environmental condition therein. In another embodiment, the control scheme may determine when to transfer substrates into the EFEM 114 or when to open the door of the substrate carrier 116.

The side storage pod 120 attached to the EFEM 114 may store substrates 435 under specific environmental conditions. For example, the side storage pod 120 may store the substrates 435 in the same environmental conditions as are present in the EFEM chamber 114C, except the gas flow rate in the side storage pod 120 may be different, such as significantly greater. The side storage pod 120 may be fluidly coupled to the EFEM chamber 114C and may receive gas (e.g., purge gas) from the EFEM chamber 114C. The side storage pod 120 may include exhaust conduits 132, 432 that exhaust gas from the side storage pod 120, which further enables the substrates 435 stored in the side storage pod 120 to be constantly exposed to the desired environmental conditions and purge gas flow rate.

In some embodiments, the side storage pod 120 may receive one or more vertically-aligned side storage containers 124, 224). For example, a first side storage container 124 may be received in the side storage pod 120. The first side storage container 124 may include an opening 126 that faces the EFEM chamber 114C. The first side storage container 124 may also include an exhaust plenum 128 located opposite the opening 126. The exhaust plenum 128 may be coupled to an exhaust conduit 132 that may couple between the exhaust plenum 128 and an exterior of the side storage pod 120.

The first exhaust conduit 132 may be made up of an internal portion and a first external portion 132A. A second conduit 234 (FIG. 2) may be coupled between a second side storage container 224 (see FIG. 2) and may include a second external portion 134B. Both the first external portion 134A and the second external portion 134B may be located within a cover 136. In some embodiments, the cover 136, rather than the first external portion 134A and the second external portion 134B, may function as a conduit to exhaust the exhausted gas from the side storage containers 124 and 224. In other embodiments, the first external portion 134A and the second external portion 134B may pass through the interior of the side storage pod 120.

Figure 2A:
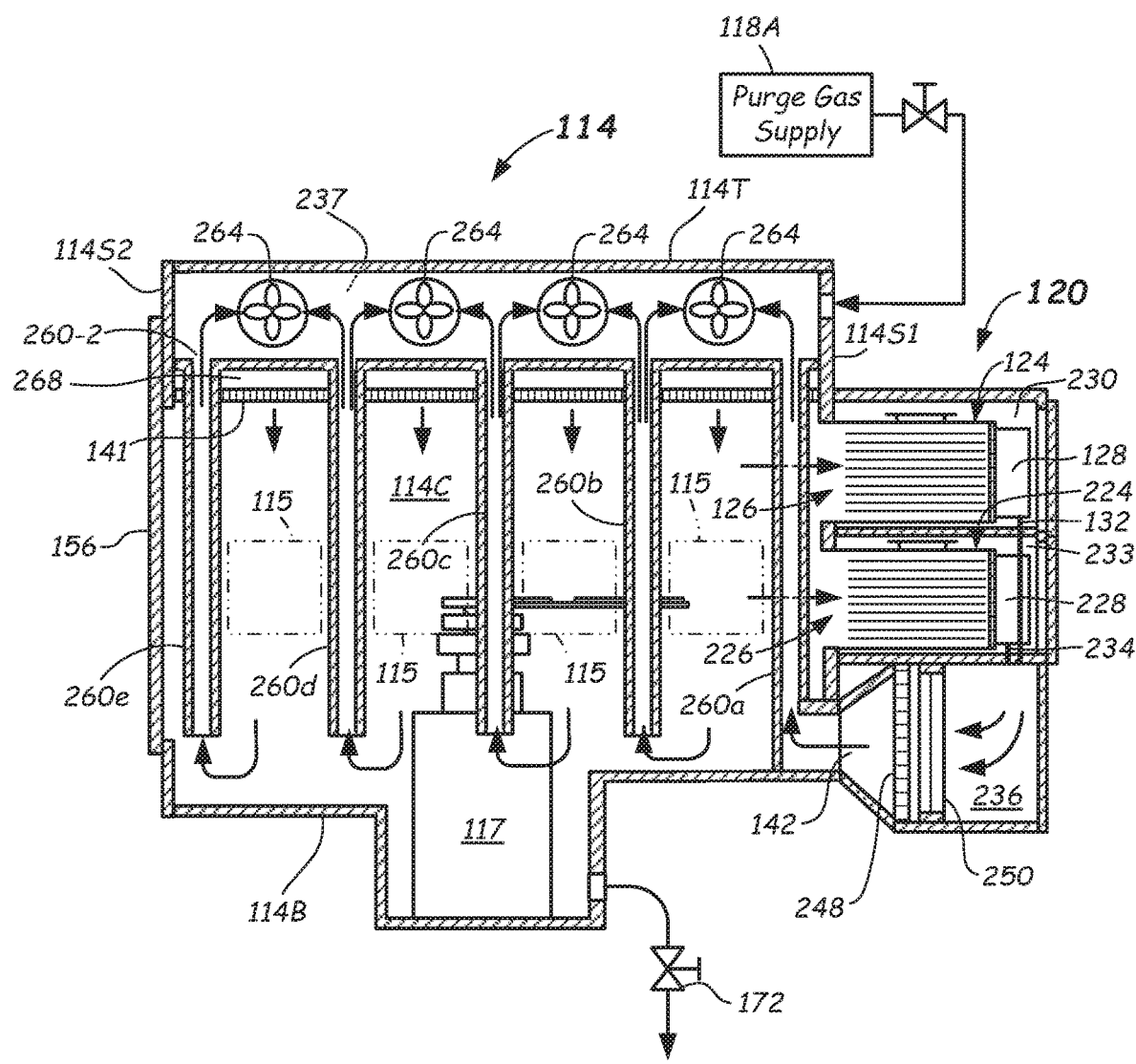
FIG. 2A illustrates a front cross-sectional view of a schematic of an equipment front end module (EFEM) including front return ducts according to one or more embodiments of the disclosure.
Figure 2B:
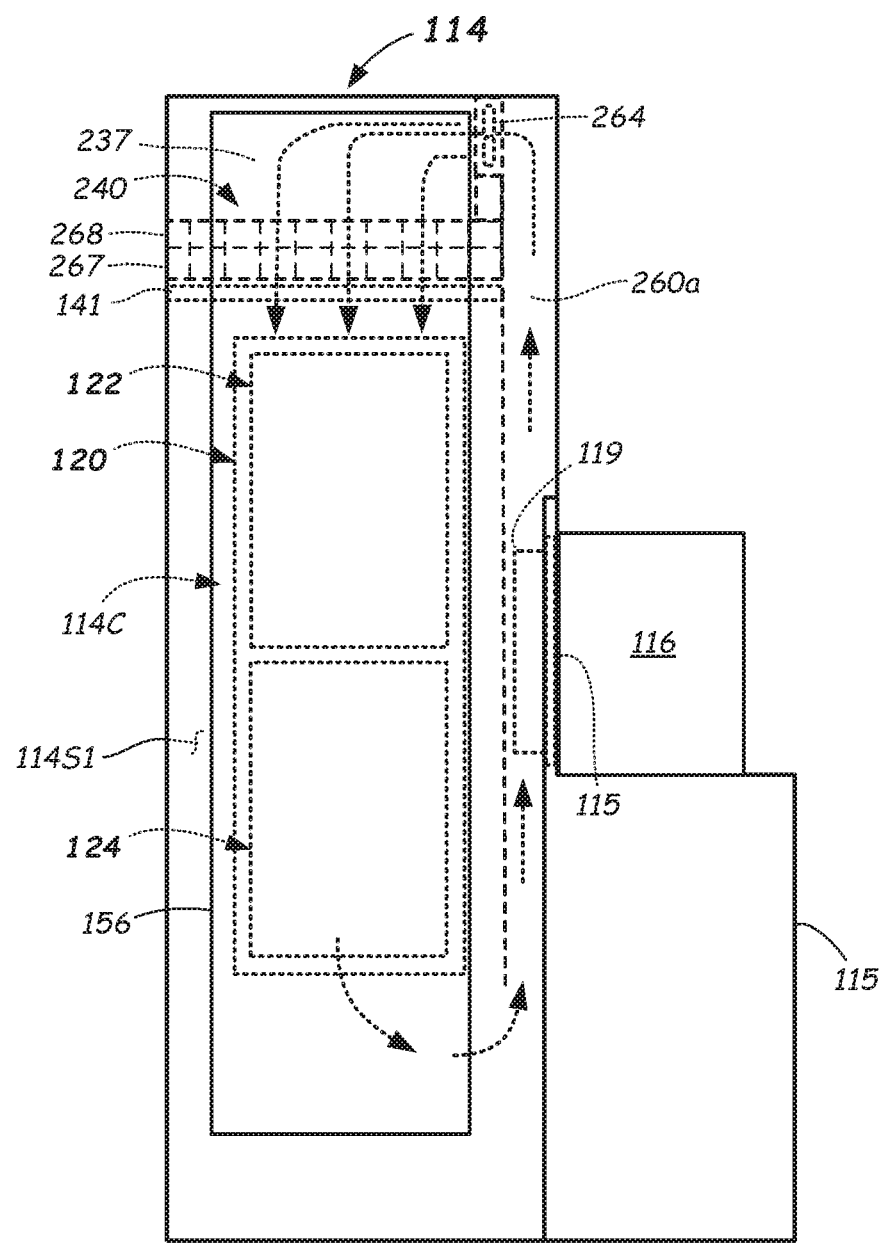
FIG. 2B illustrates a left side elevation view of the EFEM of FIG. 2A according to one or more embodiments of the disclosure.

FIGS. 2A and 2B illustrate simplified front cross-sectional and side views, respectively of the EFEM 114 including the side storage pod 120 coupled to a first side wall 114S1 of the EFEM 114. The side storage pod 120 may include a first chamber 230 that receives the first side storage container 124 and a second chamber 233 that receives the second side storage container 224. The second side storage container 224 may include an opening 226 that faces the EFEM chamber 114C. The second side storage container 224 may also include a second exhaust plenum 228 located opposite the opening 226. The second exhaust plenum 228 may be coupled to a second exhaust conduit 234 (see FIG. 4) that may couple between the exhaust plenum 228 and a common plenum 236.

Both the first external portion 134A and the second external portion 134B may be coupled to a common plenum 236 that receives the exhaust gas from the first plenum 128 of the first side storage container 124 and the second plenum 228 of the second side storage container 224. The common plenum 236 may be attached to or be a portion of the side storage pod 120, and may be located below the second side storage container 224. In some embodiments, the side storage pod 120 is removably attached to the first side wall 114S1 of the EFEM 114. Purge gas may be drawn from the common plenum 236 by a series of fans 264 located in or adjacent to the upper plenum 237. A side return duct 260a may be coupled to a channel 142 (e.g., exhaust channel) extending from the common plenum 236 to direct the exhausted gas to the upper plenum 237. In some embodiments, the gasflow through the side storage pod 120 is 150-175 cfm (4.25-5.0 cmm).

An optional filter 248 may be provided the exhaust gas flow path generated exiting the common plenum 236. For example, the filter 248 may be located at the entry into the channel 142 so that all the gas drawn by the fans 264 passes through the filter 248. In some embodiments, the filter 248 may be a chemical filter that filters one or more gases that are outgassed by one or more substrates 235 stored in the side storage pod 120 after application of a fabrication process. In some embodiments, the filter 248 can function to filter undesirable chemicals, such as chlorine, bromine, and/or fluorine. In some embodiments, the filter 248 may filter base gases, such as ammonia ($NH_3$), to less than or equal to 5.0 ppb. In some embodiments, the filter 248 may filter acidic gases, such as fluorine (F), chlorine (Cl), bromine (Br), acetate (OAc), nitrogen dioxide ($NO_2$), nitrate ($NO_3$), phosphate ($PO_4$), hydrogen fluoride (HF), and/or hydrochloric acid (HCl), to less than or equal to 1.0 ppb. In some embodiments, the filter 248 may include an activated carbon filter. In other embodiments, the filter 248 may be a particulate filter or include a combination particulate filter/chemical filter.

Optionally, a heater 250 may be provided along the exhaust gas flow path generated by the fans 264. The heater 250 may heat the exhaust gas to a predetermined temperature before the exhaust gas is recirculated into the upper plenum 237. In some embodiments, the heat generated by the heater 250 may be used as a reactant and/or to change the relative humidity in the EFEM 114 and/or in the side storage pod 120. In some embodiments, the heater 250 may heat the purge gas in the EFEM chamber 114C to increase a rate of outgassing from substrates 235 located in the side storage pod 120.

The fans 264 thus draw gas (e.g., filtered gas) through the side return duct 260a in to the upper plenum 237 where the filtered gas is recirculated back into the EFEM chamber 114C. Further, the fans 264 also draw gas from the EFEM chamber 114C through at least three of the return ducts 160b-160e to the upper plenum 237, as shown in FIG. 1 and FIGS. 2A-2B (load/unload robot not shown for clarity). The plenum 154 has an opening located adjacent the side wall of the EFEM 114 to which the side storage pod 120 is coupled. The common plenum 236 is configured to couple to the channel 142, which is coupled to the side return duct.

An access door 156 is coupled to the second side wall 114S2 of the EFEM 114. However, in some embodiments, a second side storage pod 120a may be attached to the second side wall 114S2 of the EFEM 114 instead of the access door 156. In some embodiments, the second side storage pod 120a may be attached to the second side wall 114S2 of the EFEM 114 in the same manner as the side storage pod 120 is attached to the first side wall 114S1 of the EFEM 114, including similar or identical coupling to the common plenum 236. In this embodiment, the exhaust from the second side storage pod 120a is returned to the upper plenum 237 by the side return duct 260e.

Figure 2C:
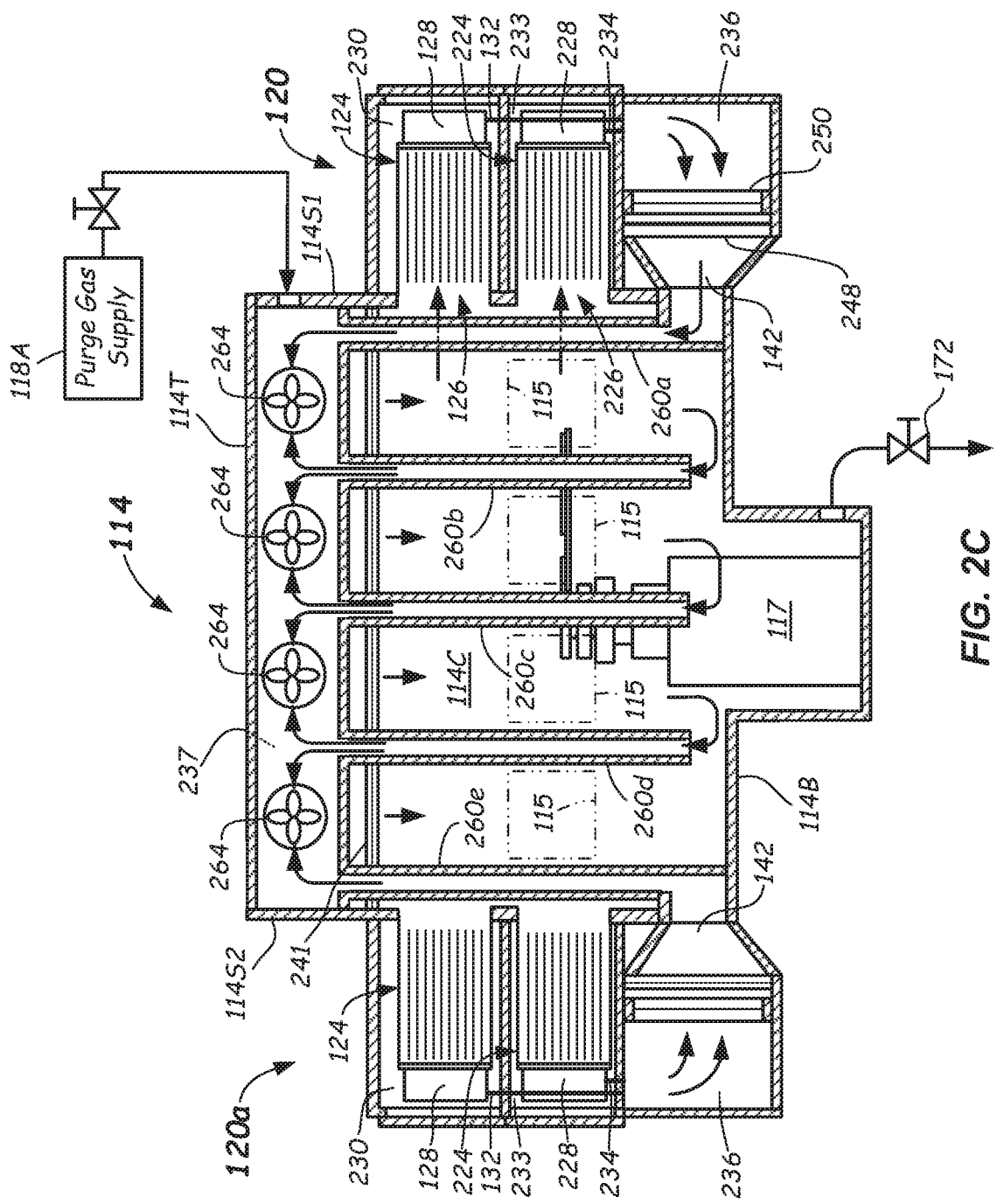
FIG. 2C illustrates a front cross-sectional view of a schematic of an equipment front end module (EFEM) including front return ducts and two side storage pods according to one or more embodiments of the disclosure.

Referring now to FIG. 2A-2C, each of the plurality of return ducts 260b-260e (FIG. 2A) and 260b-260d (FIG. 2B) has a respective first (lower) end coupled to the EFEM chamber 114C. Each one of the plurality of return ducts 260b-260e (FIG. 2A) and 260b-260d (FIG. 2B) may extend upward on an inside of the EFEM chamber 114C along the front wall 114F of the EFEM 114 and each may be parallel to one another, although they need not be. Each one of the plurality of return ducts also has a respective second (upper) end coupled to the upper plenum 237. The upper plenum 237 may extend horizontally across a top of the EFEM 114. The upper plenum 237 may have one or more openings 240 into the EFEM chamber 114C. The openings may include, above, below, or in, a particulate filter 267 and possibly a chemical filter 268. Further, a homogenization plate 141 including perforations may be provide proximate the opening 240 so as to cause a substantially laminar gas flow into and through the EFEM chamber 114C and into the side storage pod 120 (or pods 120, 120a FIG. 2C). Note that other embodiments may have more or less than the five ducts 260a-260e shown.

As should be understood, as shown in FIG. 1A, the return ducts 260a-260e may run alongside of the inside of the front wall 114F of the EFEM and some may pass in between the load ports 115 (locations of load ports 115 shown in phantom in FIG. 2A). Optionally, the return ducts 260a-260e may extend on an outside of the front wall 114F, or a combination of outside and inside (not shown).

Figure 3:
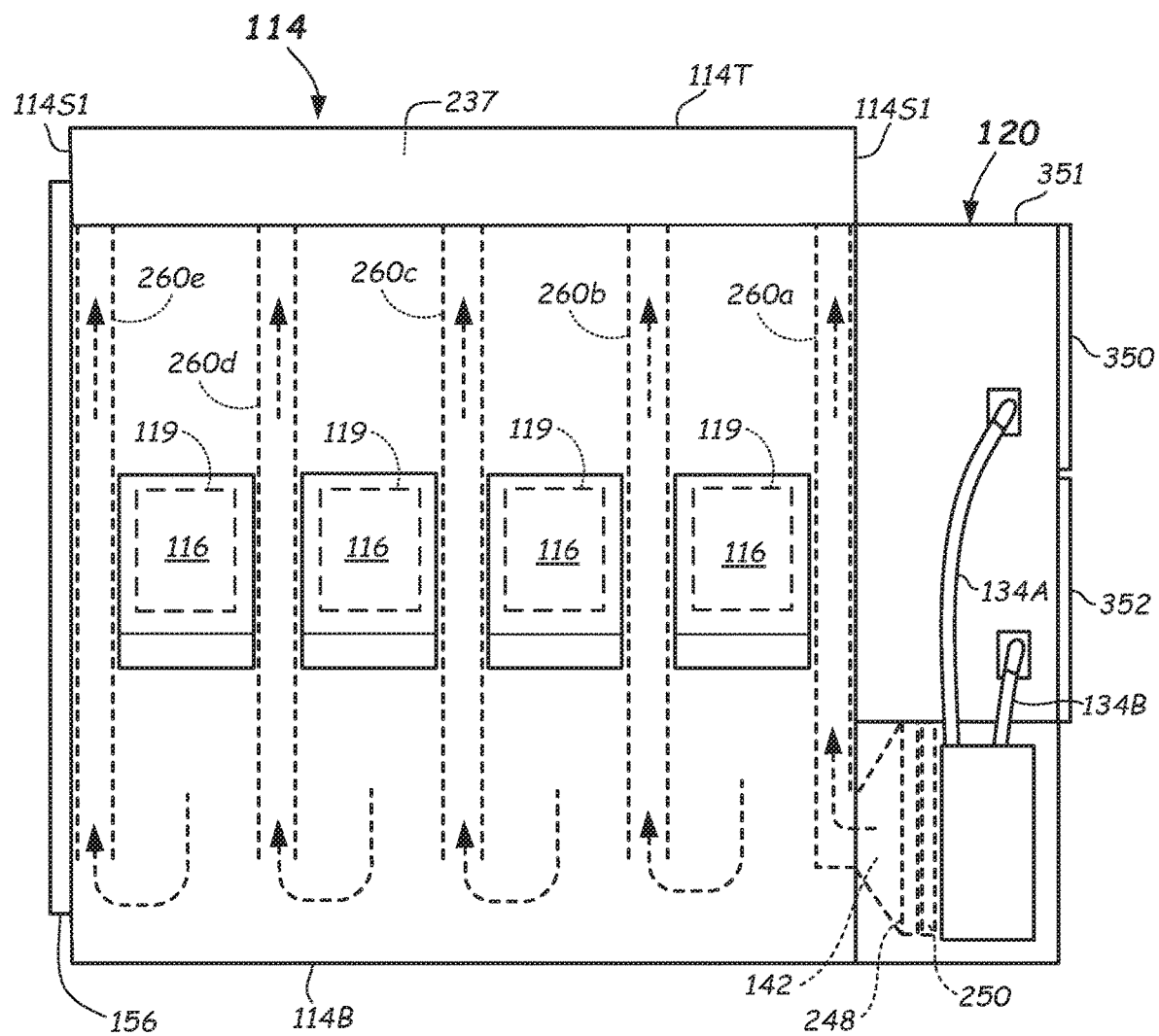
FIG. 3 illustrates a front view of an EFEM and a side storage pod coupled to the EFEM according to one or more embodiments of the disclosure.

FIG. 3 illustrates a simplified front view of the EFEM 114 and a simplified side view of an embodiment the side storage pod 120. As shown, one of the plurality of return ducts 260a-260e are each configured to extend upward along a first vertical side of a carrier door opener 119 for a load port 115 (or substrate carrier 116) and another of the plurality of ducts 260a-260e is configured to extend upward along a second vertical side of the carrier door opener 119 (or substrate carrier 116). In some embodiments, at least one of the plurality of return ducts 260a-260e is configured to extend upwardly between vertical sides of two adjacent carrier door openers 119 (or substrate carrier 116). In some embodiments, return ducts 260a-260e may have transverse cross-sectional areas of 100 mm$^2$ to 300 mm$^2$ or larger, and may be made from bent sheet metal or plastic.

Some of the advantages of the front-ducted EFEM 114 include reduced overall depth of the EFEM by utilizing otherwise unused space, improved fluid flow (e.g., less resistance through the plurality of return ducts 260a-260e by providing more total flow area), more direct and/or laminar top to bottom fluid flow within the EFEM chamber 114C by providing substantially equally distributed multiple return ducts across the front wall of the EFEM 114, and an option to attach a second side storage pod 120a to the second (left) side wall 114S2 of the EFEM 114 by providing the plurality of ducts 260a-260e along the front wall 114F of the EFEM 114 instead of through the door 156 of the second side wall 114S2 of the EFEM 114.

The embodiment of the side storage pod 120 shown in FIG. 3 may include a first door 350 and a second door 352. The first door 350 and the second door 352 may form a seal with abutting portions of the retaining enclosure 351 of the side storage pod 120. The first door 350 and the second door 352 may be hinge-type doors including hinges (not shown) or removable panel doors (e.g., screwed-on sealed panel doors) that enable access to the interior of the side storage pod 120, yet seals the side storage pod 120 when closed.

In some embodiments, a single door may be used in place of the first door 350 and the second door 352. A suitable O-ring, gasket, or other seal on the first door 350 and the second door 352, or on the end portions, may form hermetic seals with the retaining enclosure 351 of the side storage pod 120, which also may be sealed to the EFEM side wall 114S1. In some embodiments, the first door 350 may form a first sealed compartment that is separated from and separately sealable from a second sealed compartment sealed by the second door 352. The first side storage container 124 may be received in the first sealed compartment, and the second side storage container 224 may be received in the second sealed compartment. Other types of doors may be used to access the interior of the side storage pod 120.

Figure 4:
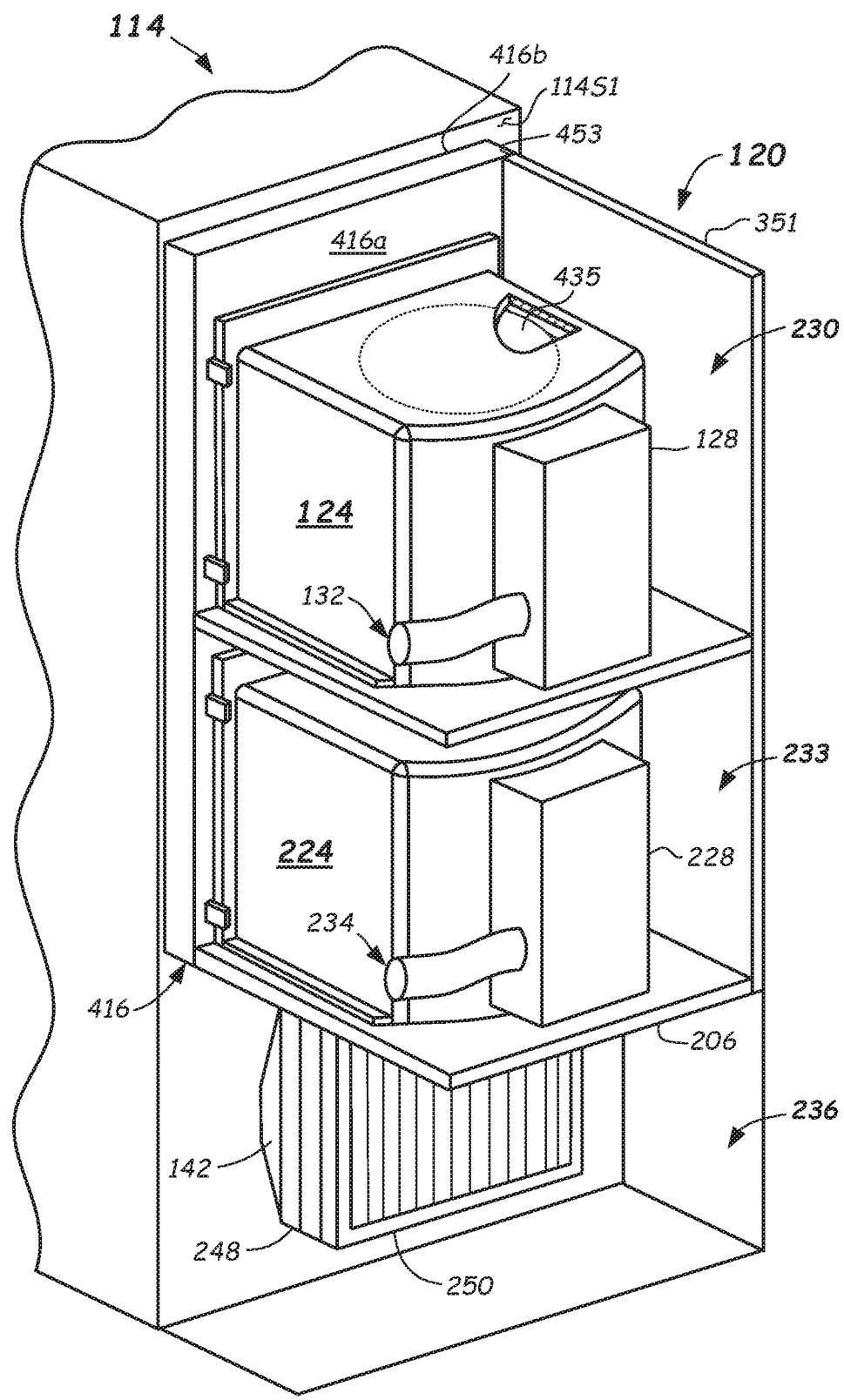
FIG. 4 illustrates a partial isometric view of a side storage pod coupled to an EFEM with walls and doors of the side storage pod removed according to one or more embodiments of the disclosure.

FIG. 4 illustrates a partial cut-away view of the side storage pod 120. The side storage pod 120 may, in some embodiments, include a mounting plate 416. An interface side 453 of the retaining enclosure 351 may be located opposite the first door 350 and the second door 352. The mounting plate 416 may include a first side 416a and a second side 416b may be attached to the interface side 453 of the retaining enclosure 351. In particular, the first side 416a of the mounting plate 416 may be attached to the interface side 453 of the retaining enclosure 351. The second side 416b of the mounting plate 416 may be attached to the first side wall 114S1 located on the exterior of the EFEM 114. The mounting plate 416 may form a hermetically-sealed interface between the EFEM chamber 114C of the EFEM 114 and the interior of the side storage pod 120 as described below. In some embodiments, the mounting plate 416 may be integrally formed with the retaining enclosure 351 or the EFEM 114.

The first chamber 230 may include the first exhaust conduit portion 132 coupled to the first side storage container 124, and the second chamber 233 may include the second exhaust conduit portion 234 coupled to the second side storage container 224. The first exhaust conduit portion 132 may be coupled to the first external exhaust conduit 134A (FIG. 3), and the second exhaust conduit portion 432 may be coupled to the second external exhaust conduit 134B (FIG. 3).

As shown, the side storage pod 120 may include the first chamber 230 and the second chamber 233. However, other embodiments of side storage pods may include a larger number of chambers, such as three or more vertically-stacked chambers. In some embodiments, the side storage pod 120 may include a single chamber. A plurality of substrates 435 are transferable between the first side storage container 124 and the EFEM 114 and/or the second side storage container 224 and the EFEM 114. For example, the load/unload robot 117 may transfer substrates 435 between the EFEM 114 and the first side storage container 124 and between the EFEM 114 and the second side storage container 224 before and/or after processing in one or more process chambers 108A-108F (FIG. 1). In some embodiments, the first side storage container 124 and/or the second side storage container 224 may each receive twenty-six substrates 435. The first side storage container 124 and the second side storage container 224 may maintain the substrates 435 under specific environmental conditions during their storage. For example, the substrates 435 may be exposed to the purge gas that is within the EFEM 114 as described above. The environmental conditions may be controlled to provide exposure to less than preselected thresholds of water and/or oxygen, or other conditions, such as specified flow rates, as specified above. Optionally, the heater 250 may operate to heat the recirculating purge gas.

Figure 5:
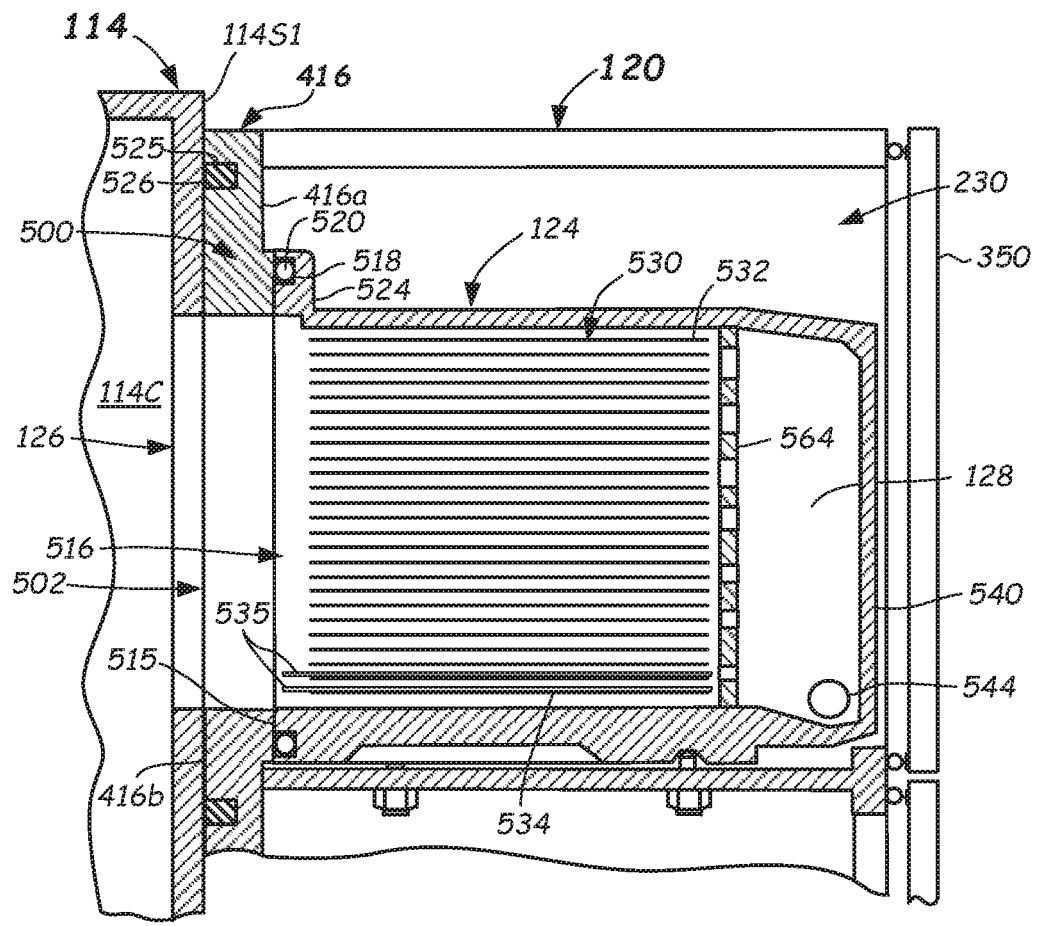
FIG. 5 illustrates a side cross-sectional view of an example interface between an EFEM and a side storage pod having a side storage container located therein according to one or more embodiments of the disclosure.

FIG. 5 illustrates a side cross-sectional view of the first side storage container 124. The second side storage container 224 (FIG. 2) may be substantially similar or identical to the first side storage container 124. The first side storage container 124 may have a pod opening 516 that is located adjacent to a panel opening 502 to form a single opening into the interior of the first side storage container 124. The panel opening 502 may be the same approximate size as the pod opening 516 and together provide the opening 126. A pod recess 518 may be formed in an upper flange 524 and may extend around the periphery of the pod opening 516. A pod seal 520 may be received within the pod recess 518. The pod seal 520 prevents gas from leaking past the interface of the front portion 515 of the first side storage container 124 and an interface portion 500 of the mounting plate 416. The pod seal 520 may be a pliable material, such as an elastomer-based material, that contacts the pod recess 518 and the interface portion 500. In some embodiments, the pod seal 520 is a pliable tube that may deform to form a seal between the pod recess 518 and the interface portion 500. Other types of seals may be used to seal the first side storage container 124 and the interface portion 500.

The second side 416b of the mounting plate 416 may have a panel recess 525 formed therein that extends around the periphery of the panel opening 502. A panel seal 526 may be received within the panel recess 525 to prevent the exchange of gas between the mounting plate 416 and the first side wall 114S1 of the EFEM 114. The panel seal 526 may be a flat seal and may be made of ethylene propylene diene monomer (EPDM) rubber, for example. In some embodiments, the panel seal 526 is about 11 mm deep and has a compression of about 5.8 mm. Other types of sealing mechanisms and materials may be used to form a seal between the first side wall 114S1 and the mounting plate 416.

The interior of the first side storage container 124 may include a plurality of substrate holders 530 configured to support substrates 435 (FIG. 4) thereon. The substrate holders 530 may be vertically-stacked shelves formed onto the lateral sides of the first side storage container 124 and may include a top substrate holder 532 and a bottom substrate holder 534. The substrate holders 530 may be spaced a distance from each other that enables gas flow around (e.g., above and below) substrates 435 received by and supported on the substrate holders 530 and that allows suitable access by the load/unload robot 117. In particular, gas entering the interior of the first side storage container 124 from the EFEM chamber 114C (FIG. 1) by way of the panel opening 502, the interface opening 504, and the pod opening 126 may flow around the substrates 435 received on the substrate holders 530. Accordingly, the substrates 435 are maintained in the desired environmental conditions.

The rear portion 540 of the first side storage container 124 may include an exhaust port 544 that couples the plenum 128 of the first side storage container 124 with the exhaust duct 132. The exhaust duct 132 coupled with the side return duct 160a may be configured to enable the above-described gas flow around the substrates 435 received on the substrate holders 530. The exhaust plenum 128 may have a height that extends vertically between the top substrate holder 532 and the bottom substrate holder 534. The exhaust plenum 128 may have a width that is approximately the width of the substrates 435. For example, the width may be about 250 mm to 350 mm for a 300 mm wafer.

Figure 6:
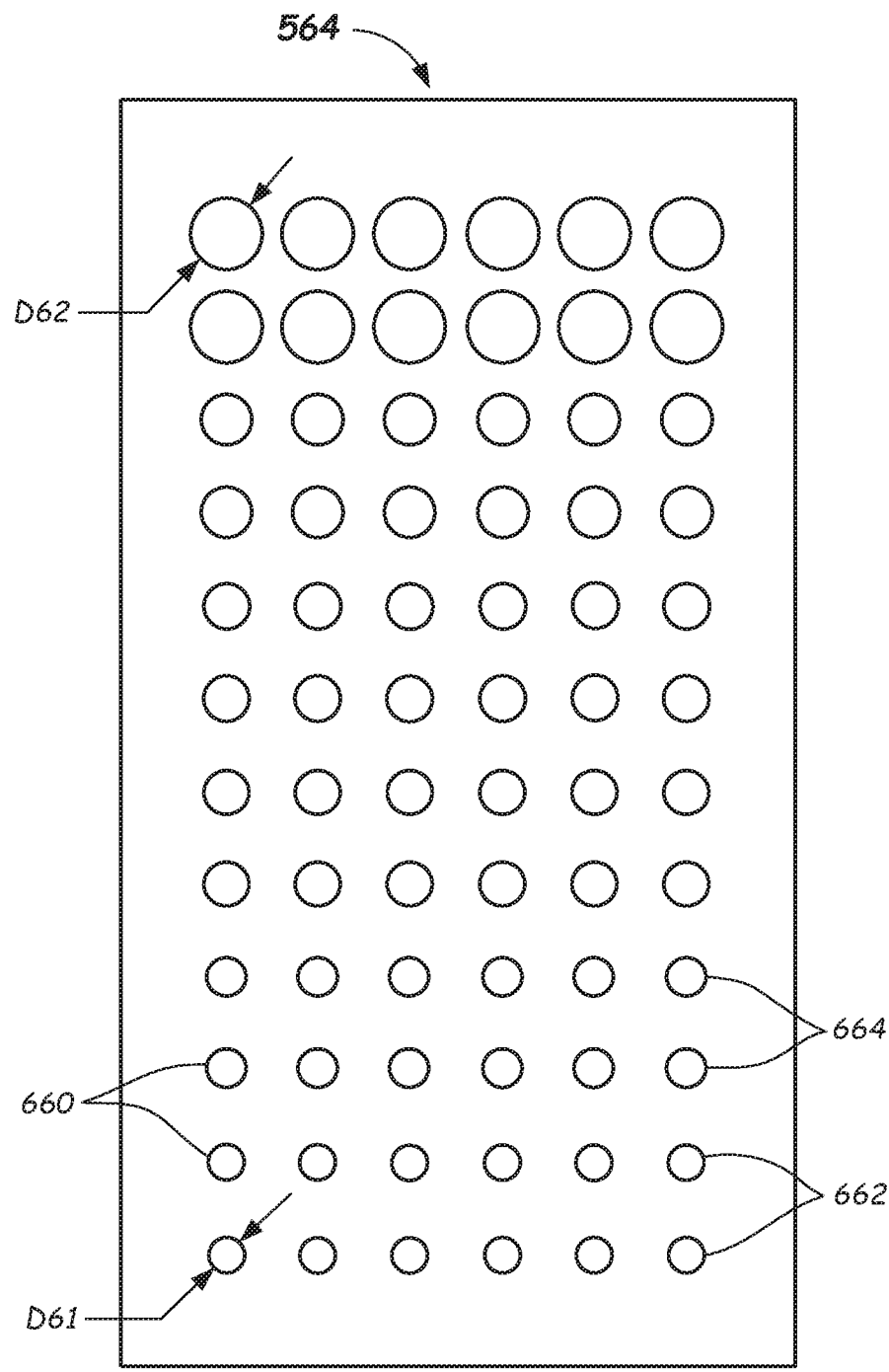
FIG. 6 illustrates a schematic front view of an exhaust baffle according to one or more embodiments of the disclosure.

An exhaust baffle 564 may be in the gas path between the substrates 435 and the exhaust plenum 128. FIG. 6 illustrates a front elevation view of an embodiment of the exhaust baffle 564. The exhaust baffle 564 may include a plurality of holes 660 (a few labeled) that balance gas flow through the first side storage container 124 such that each of the substrate receive substantially the same flow velocity. The holes 660 may have small diameters D61 at the bottom of the exhaust baffle 564 and large diameters D62 at the top of the exhaust baffle 564. The holes 660 with the smaller diameters may be located proximate to the exhaust port 544 to balance the gas flow. The larger diameters D62 may be between 15 mm and 17 mm and, in some embodiments, the larger diameters may be about 16 mm. The holes 660 may be arranged as a two-dimensional array wherein the diameters of the holes 660 progressively decrease from the top of the exhaust baffle 564 toward the bottom of the exhaust baffle 564. In some embodiments, adjacent pairs of rows of holes 660 have the same diameters. For example, a first pair of rows 662 may have holes 660 having a first diameter and a second pair of rows 664 may have holes 660 having a second larger diameter.

Figure 7:
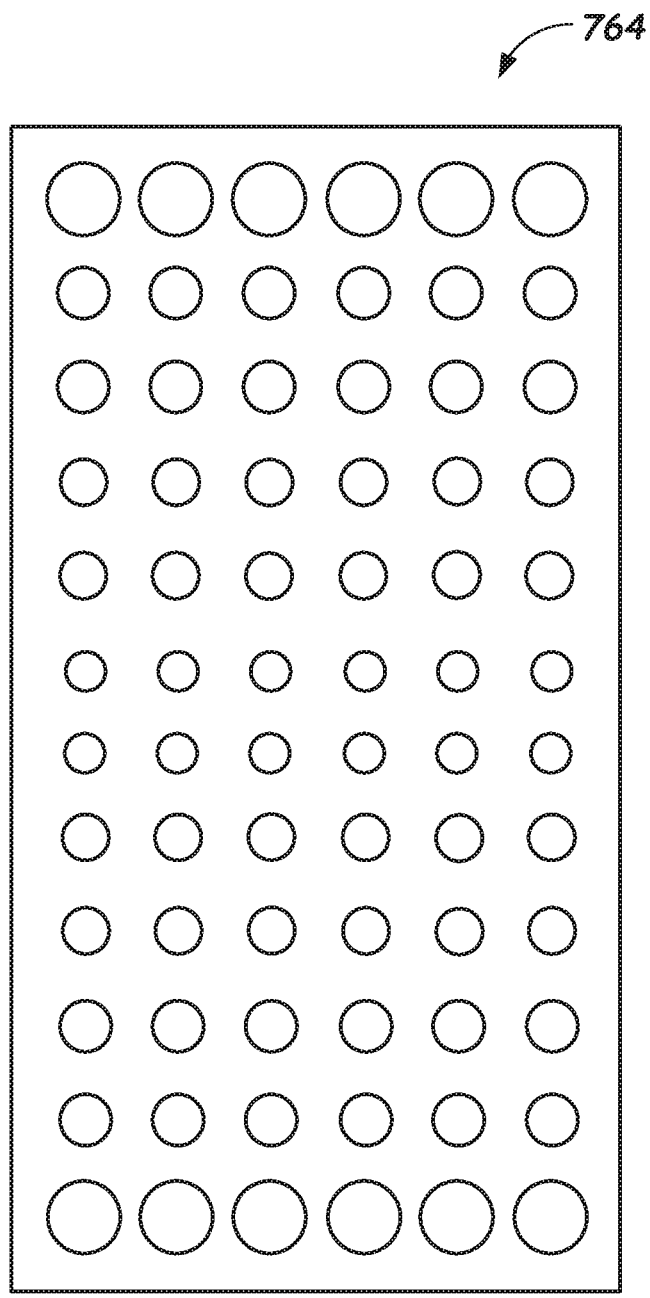
FIG. 7 illustrates a schematic front view of another exhaust baffle according to one or more embodiments of the disclosure.

FIG. 7 illustrates another embodiment of an exhaust baffle 764 that may be used in side storage containers where the exhaust port is located at about half the vertical distance of the side storage pod. As shown in FIG. 7, the holes with smaller diameters are located proximate the location of the exhaust port in the center, which balances the gas flow through the side storage pod 120.

Gas flow through the interior of the first side storage container 124 enters the pod opening 516, passes around the substrates 435 supported on the substrate holders 530, flows through the exhaust baffle 564, enters the exhaust plenum 128, and is exhausted via the exhaust port 544. The airflow configuration enables the substrates 435 received in the substrate holders 530 to be in the same environmental conditions as the EFEM 114, but achieve a greater flow velocity in some embodiments.

The same flow may occur in the second side storage container 224 wherein the exhaust gas passes through the second exhaust conduit 234 (FIG. 4) and into the second external exhaust conduit portion 134B (FIGS. 2 and 3). Exhaust gas from the first and second external exhaust conduits 134A and 134B enters the common plenum 236 (FIG. 2), where it may be heated by the heater 250. The exhaust gas may further be filtered by the chemical filter 248 to remove certain chemicals as described above.

Figure 8:
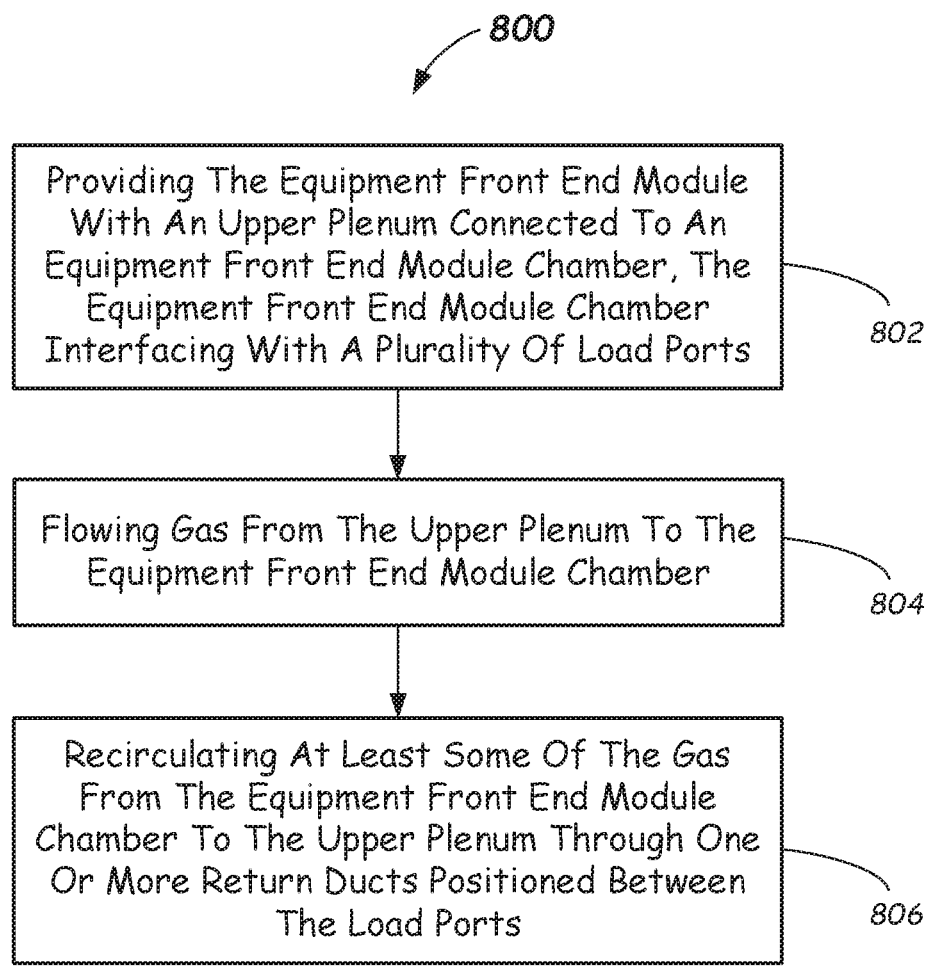
FIG. 8 illustrates a flowchart of a method of operating an EFEM according to one or more embodiments of the disclosure.

FIG. 8 illustrates a method 800 of operating an EFEM in an electronic device manufacturing assembly in accordance with one or more embodiments. At process block 802, method 800 may include providing the equipment front end module with an upper plenum connected to an equipment front end module chamber, the equipment front end module chamber interfacing with a plurality of load ports.

At process block 804, method 800 may include flowing gas from the upper plenum to the equipment front end module chamber. For example, referring to FIGS. 2A, 2B, and 3, purge gas may flow from the upper plenum 237 to the inside the EFEM chamber 114C. Some of the purge gas flow enters into the side storage pod 120 coupled to the EFEM 114 at the side wall 114S1 of the EFEM 114.

And at process block 806, method 800 may include recirculating at least some of the gas from the EFEM chamber 114C to the upper plenum through one or more return ducts positioned between the load ports. For example, each of the return ducts may extend vertically upward along an inside surface (or outside surface or combination of inside surface and outside surface) of the front wall 114F of the EFEM 114 into the upper plenum 237 of the EFEM and thereafter back down into EFEM chamber 114C. For example, referring to FIGS. 2A, 2B, and 3, filtered gas may flow from the common plenum 236, through the plurality of return ducts 260a-260e alongside of the front wall 114F, into the upper plenum 237, and then back into the EFEM chamber 114C.

In operation, some of the purge gas provided from the purge gas supply 118A into the upper plenum 237 may be removed through a base valve 172. In some embodiments, the flow of new purge gas into the EFEM 114 may be provided at a relatively slow constant rate, as may the flow of the exhaust out through the base valve 172. For example, the purge gas may be exchanged from the EFEM 114 at a rate where the entire volume of gas present in the EFEM 114 is exchanged only every few hours or less, for example. Other exchange rates may be used.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method may be altered so that certain operations may be performed in an inverse order so that certain operations may be performed, at least in part, concurrently with other operations. In another embodiment, instructions or sub-operations of distinct operations may be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. An equipment front end module, comprising:
   a front wall, a rear wall, and two side walls, the front wall including a plurality of load ports, and the rear wall configured to couple to a load lock apparatus;
   an equipment front end module chamber formed between the front wall, the rear wall, and the two side walls;
   an upper plenum at a top of the equipment front end module and including an opening into the equipment front end module chamber; and
   a plurality of return ducts that are coupled between a bottom of the equipment front end module chamber directly to the upper plenum, the plurality of return ducts providing a return gas flow path enabling recirculation of gas from the equipment front end module chamber to the upper plenum, wherein at least some of the plurality of return ducts are located between the load ports.

2. The equipment front end module of claim 1, wherein the plurality of return ducts extend alongside of the front wall.

3. The equipment front end module of claim 2, wherein at least some of the plurality of return ducts is configured to extend upward between sides of two adjacent carrier door openers.

4. The equipment front end module of claim 1, wherein a first side storage pod is coupled to at least one of the two side walls.

5. The equipment front end module of claim 4, wherein an exhaust channel from the first side storage pod is coupled to the upper plenum by a side return duct.

6. The equipment front end module of claim 1, further comprising a first side storage pod coupled to a first side wall of the two side walls, and a second side storage pod is coupled to a second side wall of the two side walls.

7. The equipment front end module of claim 1, further comprising four substrate carriers docked at the plurality of load ports and at least three return ducts providing the return gas flow path.

8. An electronic device manufacturing assembly, comprising:
   an equipment front end module including:
      a front wall, a rear wall, and two side walls, the front wall including a plurality of load ports, and the rear wall configured to couple to a load lock apparatus;
      an equipment front end module chamber formed between the front wall, the rear wall, and the two side walls;
      an upper plenum at a top of the equipment front end module and including an opening into the equipment front end module chamber;
      a plurality of return ducts that are coupled between a bottom of the equipment front end module chamber directly to the upper plenum, the plurality of return ducts providing a return gas flow path enabling recirculation of gas from the equipment front end module chamber to the upper plenum, wherein at least some of the plurality of return ducts are located between some of the plurality of load ports;
      a first side storage pod coupled to a first side wall of the two side walls of the equipment front end module via an interface opening in the first side wall, the first side storage pod configured to receive one or more substrates from the equipment front end module chamber, the first side storage pod comprising an exhaust channel; and
      a first side return duct coupled between the exhaust channel and the upper plenum.

9. The electronic device manufacturing assembly of claim 8, wherein each of two of the plurality of load ports comprise a carrier door opener and one of the plurality of return ducts is configured to extend upward between sides of the carrier door openers.

10. The electronic device manufacturing assembly of claim 8, wherein at least some of the plurality of return ducts are configured to extend upward along an inside surface of the front wall.

11. The electronic device manufacturing assembly of claim 8, wherein at least some of the plurality of return ducts are configured to extend upward along an outside surface of the front wall.

12. The electronic device manufacturing assembly of claim 8, wherein the first side storage pod further comprises:
   one or more chambers, each of the one or more chambers having a chamber opening located adjacent to the interface opening; and
   one or more side storage containers located in the one or more chambers, each of the one or more side storage containers configured to receive the one or more of the substrates from the equipment front end module chamber, each of the one or more side storage containers coupled to the exhaust channel and configured to exhaust gas entering from the chamber opening.

13. The electronic device manufacturing assembly of claim 12, further comprising a chemical filter located in a second plenum coupled to the exhaust channel.

14. The electronic device manufacturing assembly of claim 12, further comprising:
   a common plenum; and
   an exhaust baffle located in the one or more side storage containers between the chamber opening and the common plenum.

15. The electronic device manufacturing assembly of claim 14, further comprising a heater configured to heat an exhaust gas exiting the common plenum.

16. The electronic device manufacturing assembly of claim 8, further comprising a second side storage pod coupled to a second side wall of the two side walls of the equipment front end module via an interface opening in the second side wall, the second side storage pod configured to receive one or more substrates from the equipment front end module chamber.

17. The electronic device manufacturing assembly of claim 16, wherein the second side storage pod comprises a second exhaust channel, and a second side return duct is coupled between the second exhaust channel and the upper plenum.

18. A method of operating an equipment front end module, comprising:
providing the equipment front end module with an upper plenum connected to an equipment front end module chamber, the equipment front end module chamber interfacing with a plurality of load ports;
flowing gas from the upper plenum to the equipment front end module chamber; and
recirculating at least some of the gas from the equipment front end module chamber to the upper plenum through one or more return ducts positioned between the load ports and that are routed between a bottom of the equipment front end module chamber directly to the upper plenum.

19. The method of claim 18, further comprising flowing some of the gas from the equipment front end module chamber into a first side storage pod.

20. The method of claim 19, further comprising exhausting gas from the first side storage pod through a first side return duct to the upper plenum.

21. The method of claim 20, further comprising exhausting gas from a second side storage pod through a second side return duct to the upper plenum.

22. The method of claim 20, further comprising passing the gas exhausting from the first side storage pod through a chemical filter of the first side storage pod to output filtered gas therefrom.

23. The method of claim 20, further comprising heating the gas exhausting from the first side storage pod.

* * * * *